(12) United States Patent
Hall et al.

(10) Patent No.: US 10,215,797 B2
(45) Date of Patent: Feb. 26, 2019

(54) SMART BLINDS PCB TEST APPARATUS

(71) Applicants: David R. Hall, Provo, UT (US); Emily Brimhall, Alpine, UT (US); Austin Carlson, Provo, UT (US); Mark Madsen, Provo, UT (US); Lloyd J. Wilson, Herriman, UT (US)

(72) Inventors: David R. Hall, Provo, UT (US); Emily Brimhall, Alpine, UT (US); Austin Carlson, Provo, UT (US); Mark Madsen, Provo, UT (US); Lloyd J. Wilson, Herriman, UT (US)

(73) Assignee: Hall Labs LLC, Provo, UT (US)

( * ) Notice: Subject to any disclaimer, the term of this patent is extended or adjusted under 35 U.S.C. 154(b) by 157 days.

(21) Appl. No.: 15/479,543

(22) Filed: Apr. 5, 2017

(65) Prior Publication Data
US 2018/0292451 A1    Oct. 11, 2018

(51) Int. Cl.
  *G01R 31/28*    (2006.01)
(52) U.S. Cl.
  CPC ..... *G01R 31/2808* (2013.01); *G01R 31/2803* (2013.01)

(58) Field of Classification Search
  CPC .... G01R 1/04; G01R 1/07328; G01R 31/043; G01R 31/2805; G01R 1/0408; G01R 31/2601; G01R 31/2891; H05K 2201/09009
  See application file for complete search history.

(56) References Cited

U.S. PATENT DOCUMENTS

| | | | |
|---|---|---|---|
| 5,408,189 A * | 4/1995 | Swart | G01R 1/07314 324/750.22 |
| 2016/0025803 A1* | 1/2016 | Jia | G01R 31/2808 324/750.25 |
| 2016/0103176 A1* | 4/2016 | Zeise | G01R 31/2891 324/750.23 |

* cited by examiner

*Primary Examiner* — Tung X Nguyen

(57) ABSTRACT

A printed circuit board (PCB) test apparatus and testing method are described. The PCB test apparatus includes a motor connected to a gearbox that includes a gear that is directly connected to an output shaft. The test apparatus includes two printed circuit board connections for testing an electric-component connector that includes two circuit boards. One connection port includes a plurality of contact pins for attaching one of the PCBs while the other connector port is part of a position encoder that includes a diametrically magnetized magnet that tests the other PCB's ability to detect changes in magnetic fields. The apparatus is configured such that both PCBs of the electric-component connector are tested in tandem.

20 Claims, 5 Drawing Sheets

SMART BLINDS PCB TEST APPARATUS

TECHNICAL FIELD

The present disclosure relates generally to the field of printed circuit board testing. More specifically, the present disclosure relates to testing printed circuit boards with a diametrically magnetized magnet.

BACKGROUND

Motorized window coverings, such as blinds or roller shades, can be programmed to raise and lower in response to manual inputs, timers, environmental stimuli, etc. However, there may be instances where raising a window covering is dangerous due to a child getting caught in the strings of the blind as it rises. In these situations it may be necessary to program the motorized blinds to quickly stop the window covering from rising. To stop the rising process during emergency situations, the motorized window covering may utilize printed circuit boards (PCBs). In some instances, electric-component connectors for motorized window coverings include two PCBs that function in tandem. One PCB may need to respond to changes in magnetic fields while the other PCB may need to respond to electric signals.

During the manufacturing process, it may be useful to test the viability of PCBs before they are installed into motorized window coverings. Waiting until after the PCBs are installed to test the motorized window covering can be costly and time consuming. If a PCB fails after it has been installed in the motorized window covering, the window covering may need to be fully disassembled and reassembled in order to conduct another test. Apparatus and methods exist for testing PCBs, but existing technology does not provide a way to test electric-component connectors that include two PCBs that function in tandem where one PCB responds to changes in magnetic fields while the other PCB responds to electric signals.

SUMMARY OF THE INVENTION

The invention has been developed in response to the present state of the art and, in particular, in response to the problems and needs in the art that have not yet been fully solved by currently available apparatus and methods. Specifically, a printed circuit board (PCB) test apparatus and a method for testing PCBs are needed for an electrical-component connector that includes two PCBs with one needing to respond to changes in magnetic fields and the other needing to respond to electrical signals. Accordingly, an apparatus is disclosed herein that tests two PCBs simultaneously with a simulated calibration test. The apparatus includes two PCB connection ports, one of which is part of a position encoder that includes a diametrically magnetized magnet. The method includes a test for evaluating the ability of the PCB that detects changes in magnetic fields to work in tandem with the PCB that responds to electrical signals in order to operate a hard-stop control that can stop a motorized window covering from rising during instances where a child may be caught in for the blinds.

BRIEF DESCRIPTION OF THE DRAWINGS

The written disclosure herein describes illustrative embodiments that are non-limiting and non-exhaustive. Reference is made to certain of such illustrative embodiments that are depicted in the figures, in which.

DETAILED DESCRIPTION

It will be readily understood that the components of the present invention, as generally described and illustrated in the Figures herein, may be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

Figure 1:
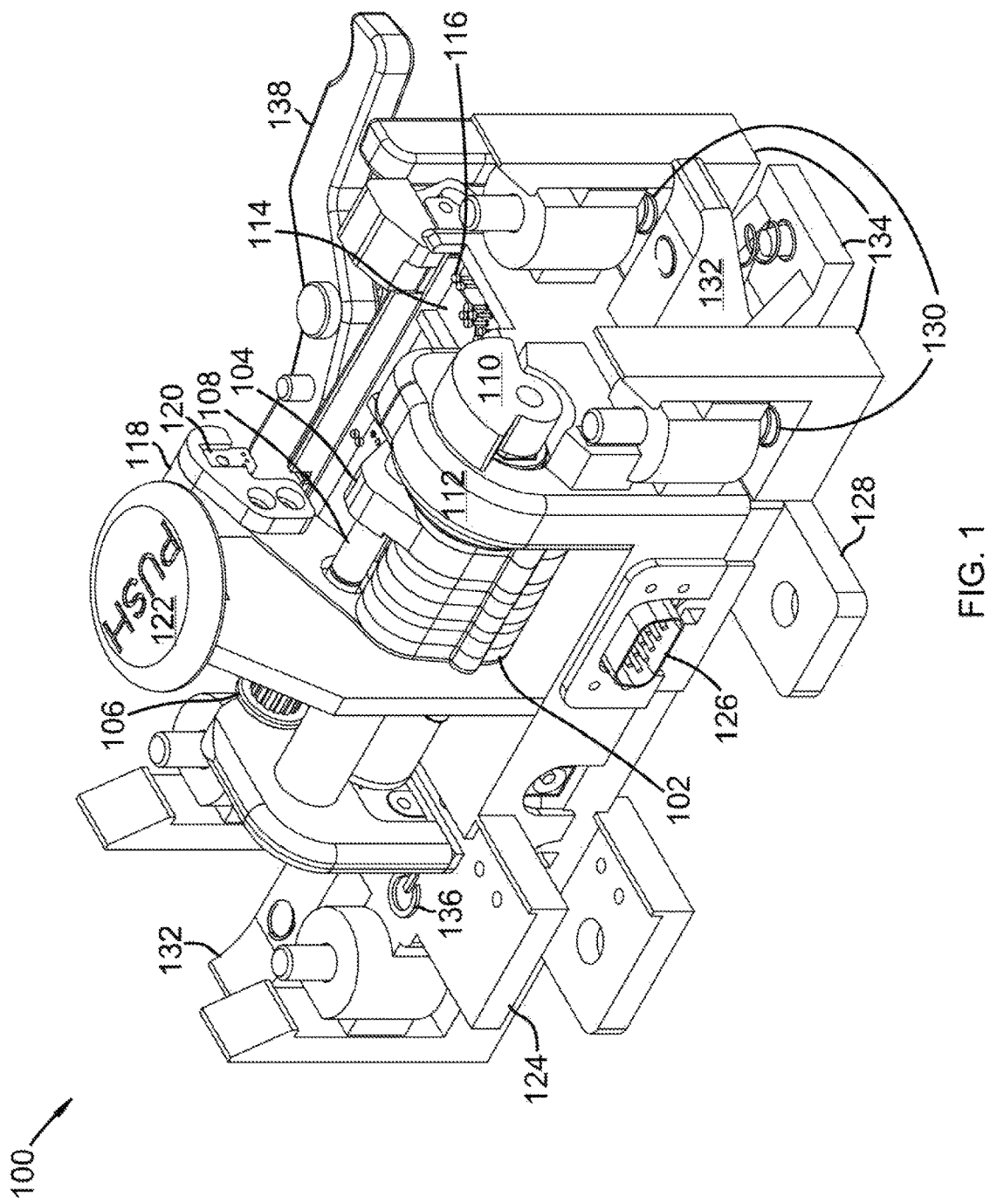
FIG. 1 is an isometric view from a posterior angle showing one embodiment of a test apparatus for PCBs.

FIG. 1 is an isometric view showing one embodiment of a test apparatus 100 for printed circuit boards (PCBs). The test apparatus 100 may include a motor 102 coupled to a gearbox 104 that includes a gear 106 directly connected to an output shaft 108. Adjacent to the motor 102 is a support frame 112 for a hard-stop control 110. The test apparatus 100 also includes a first PCB connection port 114 that includes a plurality of contact pins 116 for attaching a lower portion of an electric-component connector that includes a first PCB. The electric component connector also includes a second PCB that attaches to a second PCB connection port 120 and detects changes in a magnetic field created by a diametrically magnetized magnet.

The diametrically magnetized magnet and second PCB connection port 120 are included within a position encoder 118. The position encoder 118 may also include a magnetic shield comprising a permalloy, mu-metal, nanocrystalline grain structure, or ferromagnetic metal coating that encloses portions of the diametrically magnetized magnet such that only the second PCB detects changes in the magnetic field when inserted into the second PCB connection port 120. The magnetic shield substance creates a magnetic field that cancels out portions the magnetic field produced by the diametrically magnetized magnet such that no magnetic field will be able to be detected outside of the second PCB connection port 120, thus magnetically isolating the first PCB connection port 114 and the first PCB from the magnetic field of the diametrically magnetized magnet. The ferromagnetic metal coating, according to various embodiments, may include nickel, iron, and/or cobalt. The diametrically magnetized magnet may be a permanent magnet.

The first PCB connection port 114 is in a longitudinal position spatially separated below the second PCB connection port 120, which is in a latitudinal position, such that a gap forming an unfilled space separates the first PCB connection port 114 from the second PCB connection port 120. The first PCB and the second PCB of the electric-component connector are tested in tandem in order to stop the hard-stop control 110. Upon pushing the push button 122 that activates the test of the first and second PCBs, a platform 124 lowers and pushes against a plurality of shock dampers 130. Release valve bases 134 support the shock dampers 130 as well as release valves 132 for releasing the electric-component connector comprising the two PCBs from the test apparatus 100. The platform 124 also includes a dataport 126 into which calibration data is input into the test apparatus 100 to conduct the test. A housing 128 supports the platform 124, which is suspended above the housing by the plurality of shock dampers 130. When a test is conducted, the shock dampers 130 are depressed, but the shock dampers 130 are released and return to their natural resting state when the test apparatus 100 is dormant.

An alignment arm 138 positions the first circuit board of the electric-component connector within the first PCB connection port 114 during testing. The alignment arm 138 may be spring loaded, according to one embodiment, such that it pushes against the first PCB by default and is released by applying pressure to a portion of the alignment arm that is on the other side of a fulcrum from the portion of the alignment arm 138 that pushes against the first PCB. The test apparatus 100 may also include a power flow indicator 136 comprising a visual signal, that indicates to a user whether power being supplied to the test apparatus 100 at any given time. The test apparatus 100 may include its own power source, according to one embodiment, that is internal to the device and includes an internal battery. In another embodiment, the power source may be external to the test apparatus 100, and include a power cord to connect the test apparatus 100 to the external power source.

Figure 2:
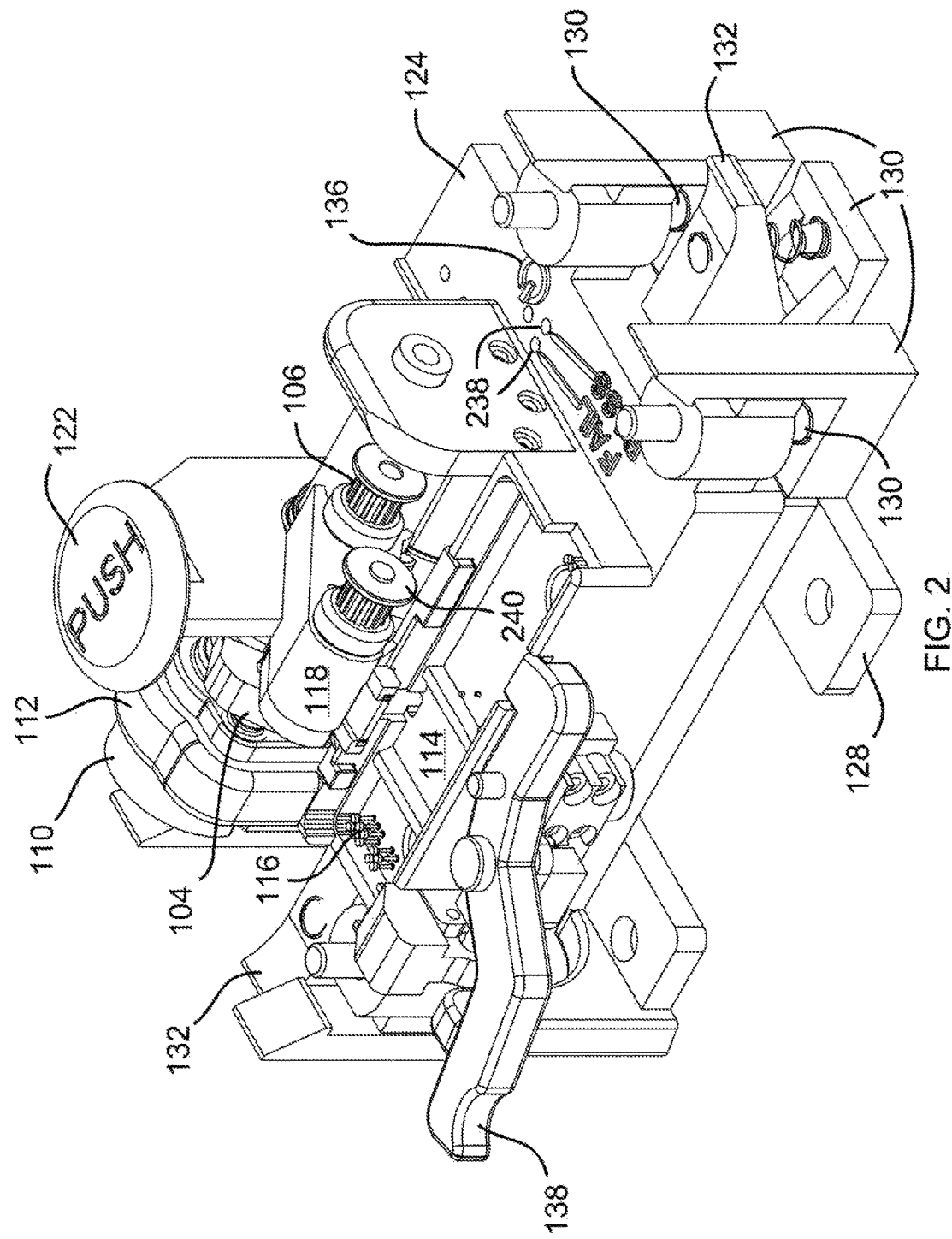
FIG. 2 is an isometric view from an anterior angle showing the test apparatus of FIG. 1.

FIG. 2 is an isometric view from an anterior angle showing the test apparatus 100 of FIG. 1. The first circuit board of the electric-component connector is placed on the first PCB connection port 114, while the second PCB connection port would connection to the second PCB connection port (see FIG. 1) on the position encoder 118. The gear 106 that is directly connected to the output shaft (see FIG. 1) may comprise a mechanical belt that transmits power to a second gear 240 that is connected to a diametrically magnetized magnet of the position encoder 118. After pushing the push button 122, the platform 124 lowers within the housing 128 and the motor (FIG. 1) begins to turn gears within the gearbox 104. The gears turn the output shaft (see FIG. 1), which in turn rotates the gear 106 that includes the mechanical belt. Rotation of the second gear 240 causes the diametrically magnetized magnet to cause changes in a magnetic field, which is then detected by the second PCB.

In response to the changes in the magnetic field that are detected by the second PCB and data received by the first PCB, the electric-component connector may cause a hard stop of the hard-stop control (FIG. 1). Whether or not the first and second PCBs successful cause a hard stop, the viability of the test will be indicated via one or more viability signals 238, which indicate whether the PCBs of the electric-component connector passed or failed the test. The viability signals 238 may include a digital, electrical, and/or mechanical output, according to various embodiments.

Figure 3:
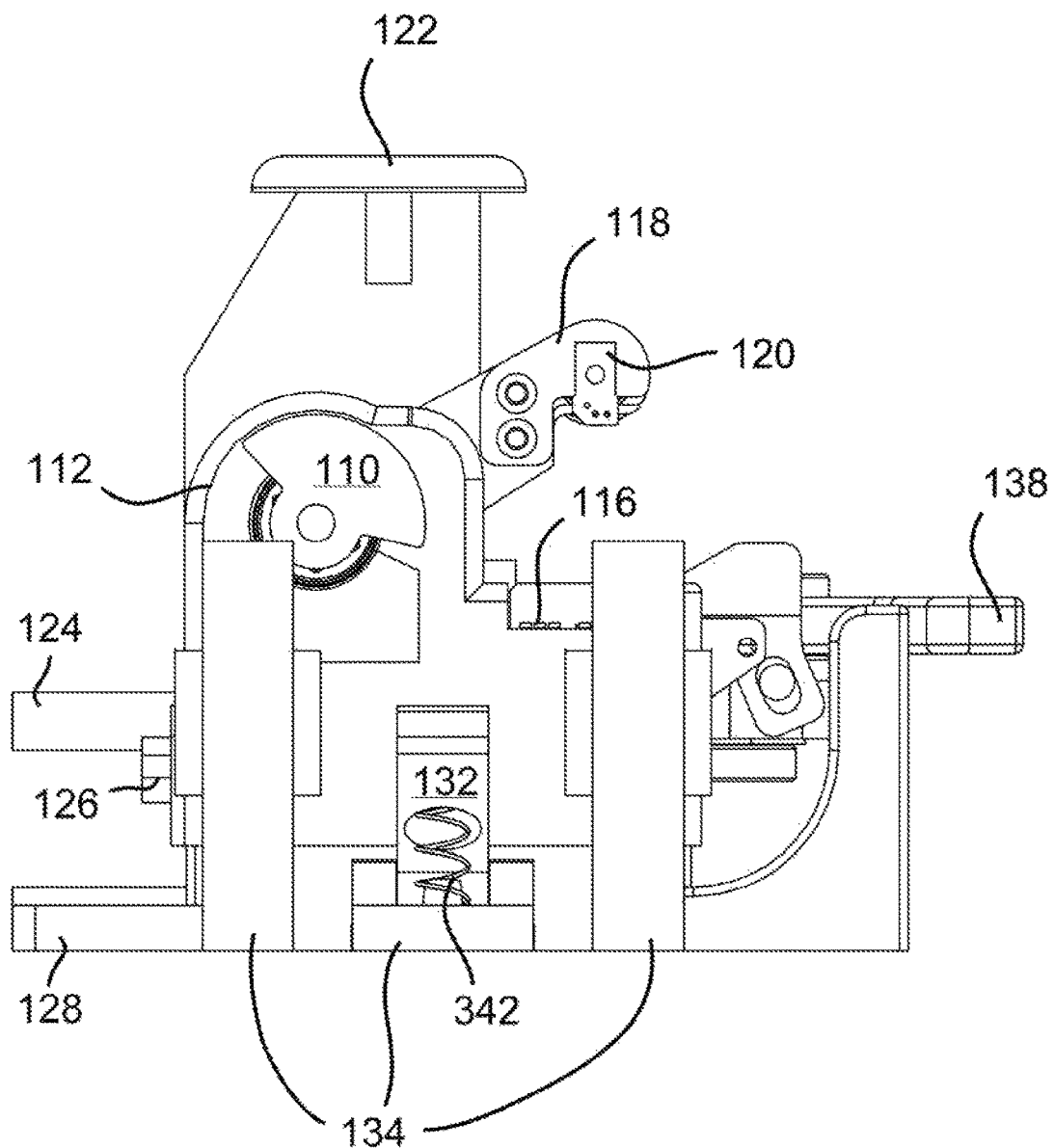
FIG. 3 is a side view of the test apparatus of FIGS. 1 and 2.

FIG. 3 is a side view of the test apparatus 100 of FIGS. 1 and 2. The hard-stop control 110 may turn about an axis if the PCBs pass the viability test. After the test has been completed, the PCBs of the electric-component connector are released by pushing down on the release valves 132. The platform 124 that was putting downward pressure on the shock dampers (see FIGS. 1 and 2) then lifts back up to the resting state as the shock dampers (see FIGS. 1 and 2) provide upward pressure. The release valves 132 are supported by springs 342, which pop the release valves 132 up to later lock in the platform 124 the next time the push button 122 is pressed for the next test.

Figure 4:
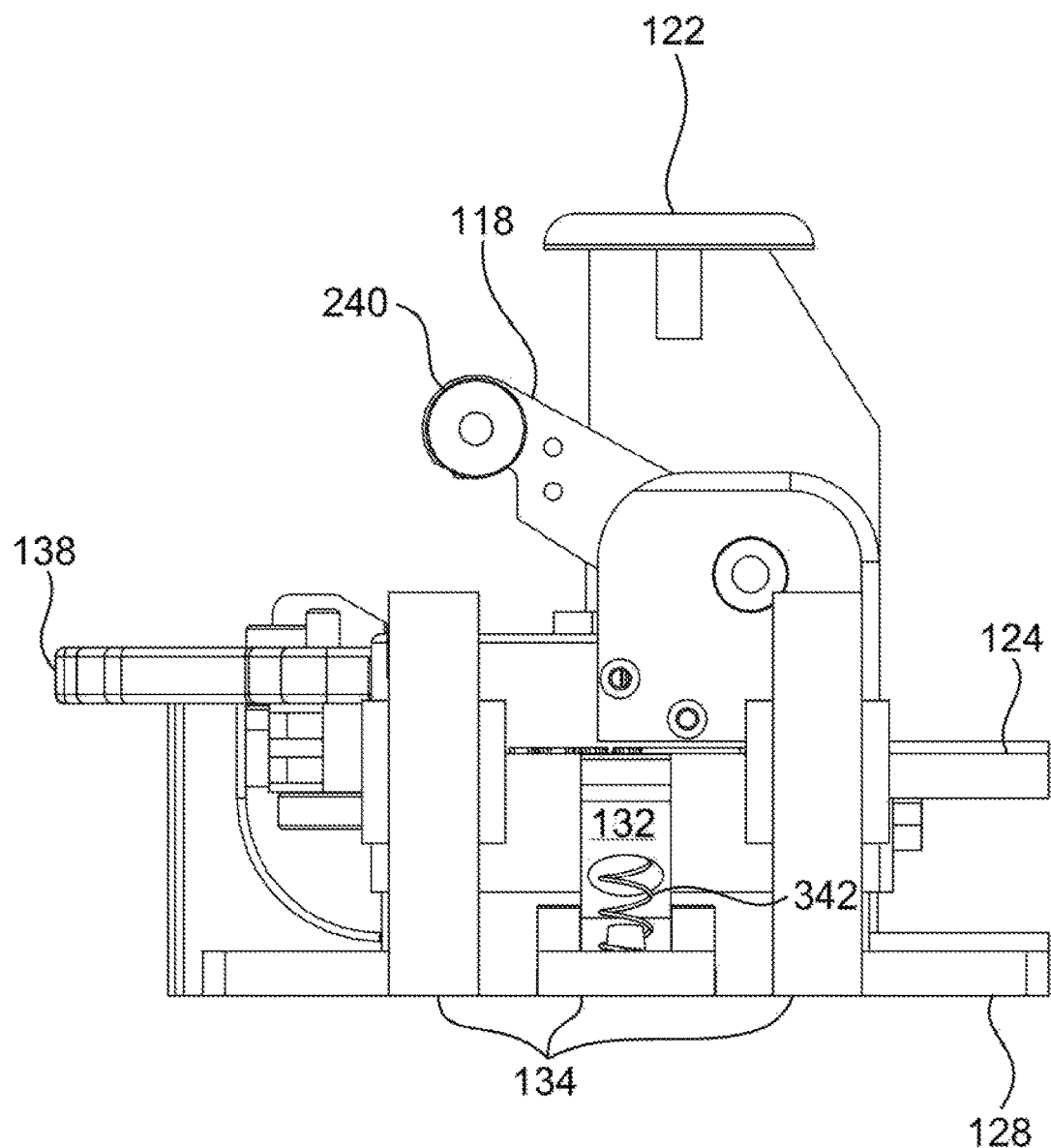
FIG. 4 is an alternative side view of the test apparatus of FIGS. 1, 2, and 3.

FIG. 4 is a view of the opposite side of the test apparatus 100 of FIG. 3. As shown in FIG. 3, there is a release valve 132 on this side of the test apparatus 100 as well that is used to lock in the platform 124 during a test. The position encoder 118 provides support for the second gear 240, which causes changes to the magnetic field of the diametrically magnetized magnet.

Figure 5:
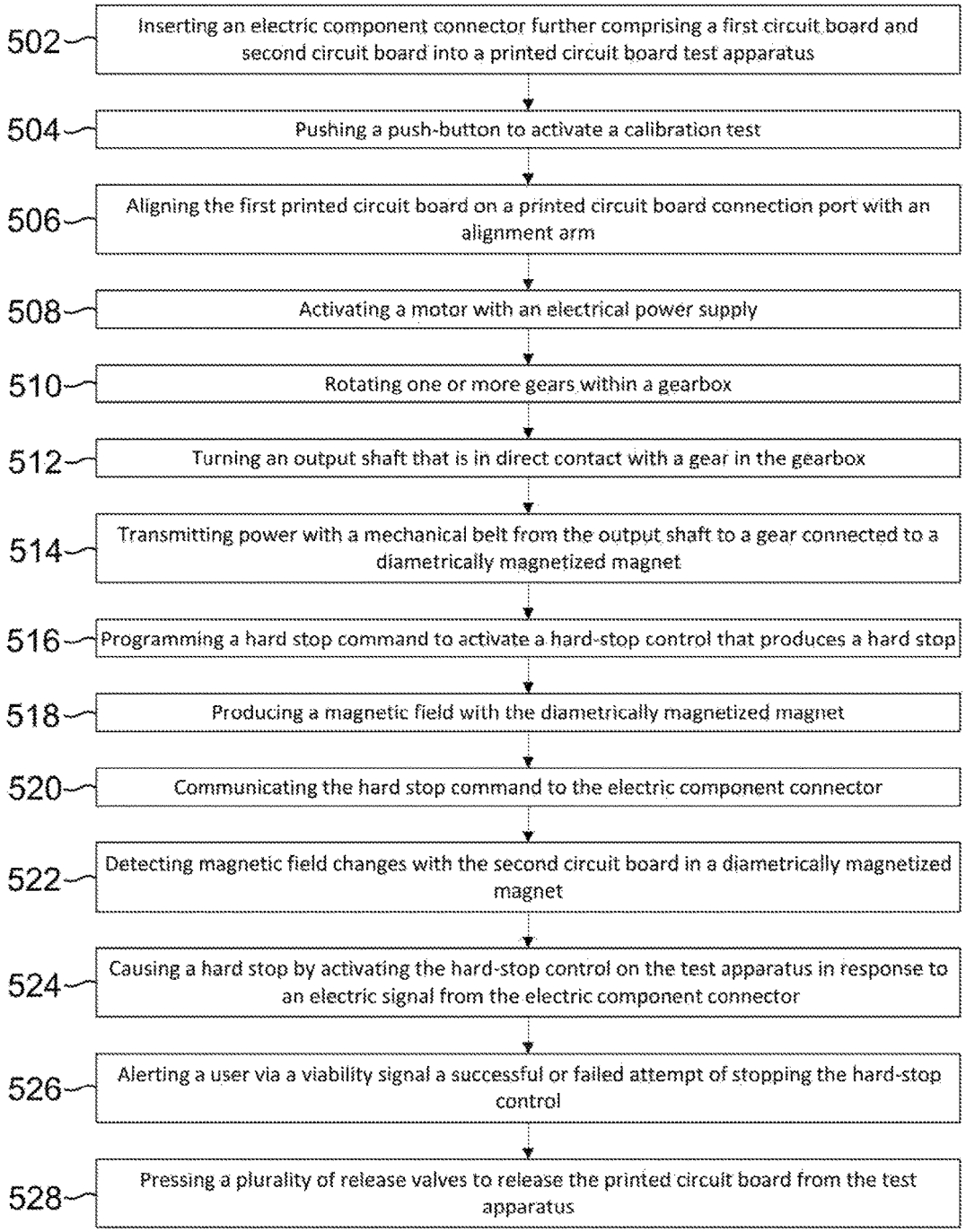
FIG. 5 is block diagram of an exemplary method for testing a PCB.

FIG. 5 is a block diagram of an exemplary method for testing a PCB 500. The method 500 begins by inserting an electric component connector that includes a first circuit board and a second circuit board into a PCB test apparatus 502. The method 500 further involves pushing a push-button to activate a calibration test 504 which starts by aligning the first PCB on a PCB connection port with an alignment arm 506. The next part of the method 500 includes activating a motor with an electrical power supply 508 and rotating one or more gears within a gearbox 510. Next, the method 500 includes turning an output shaft that is in direct contact with a gear in the gearbox 512 and transmitting power with a mechanical belt from the output shaft to a gear connected to a diametrically magnetized magnet 514.

The method 500 also involves programming a hard stop command to activate a hard-stop control that produces a hard stop 516 and producing a change in the magnetic field of the diametrically magnetized magnet 518. These steps are followed by communicating the hard stop command to the electric component connector 520 and detecting magnetic field changes with the second circuit board in a diametrically magnetized magnet 522. The method 500 includes causing a hard stop by activating the hard-stop control on the test apparatus in response to an electric signal from the electric component connector 524. Last, the method 500 includes alerting a user via a viability signal of a successful or failed attempt at stopping the hard-stop control 526 and pressing a plurality of release valves to release the PCBs from the test apparatus 528.

The invention claimed is:

1. A test apparatus for printed circuit boards comprising:
a motor;
a gearbox coupled to the motor and comprising a gear directly connected to an output shaft;
a hard-stop control connected to a support frame adjacent to the motor;
a first printed circuit board connection port comprising a plurality of contact pins for attaching a lower portion of an electric-component connector that includes a first printed circuit board;
a position encoder comprising:
 a diametrically magnetized magnet;
 a second printed circuit board connection port for attaching an upper portion of the electric-component connector that includes a second printed circuit board that detects magnetic field changes in the diametrically magnetized magnet;
 a magnetic shield enclosing portions of the diametrically magnetized magnet such that changes in the magnetic field are detected only by the second printed circuit board when inserted into the second printed circuit board connection port, and the first printed circuit board is magnetically isolated from the diametrically magnetized magnet; and
 wherein the magnetic shield comprises a permalloy, mu-metal, nanocrystalline grain structure, or ferromagnetic metal coating;
wherein the first printed circuit board connection port is in a longitudinal position spatially separated below the second printed circuit board connection port, which is in a latitudinal position, such that a gap forming an unfilled space separates the first printed circuit board connection port from the second printed circuit board connection port; and wherein the test apparatus tests both the first printed circuit board and the second printed circuit board of the electric-component connector in tandem.

2. The test apparatus of claim 1 further comprising a push-button for activating a test of the first and second printed circuit boards.

3. The test apparatus of claim 1 further comprising a platform, wherein the platform comprises a dataport for inputting calibration data.

4. The test apparatus of claim 3, wherein the platform is suspended above a housing and supported by a plurality of shock dampers connected to the housing that are depressed during testing and released when dormant.

5. The test apparatus of claim 4, wherein the plurality of shock dampers are supported by a plurality of release valve bases that support release valves for releasing printed circuit boards from the test apparatus.

6. The test apparatus of claim 1 further comprising one or more viability signals, wherein the signals comprise a digital, electrical, and/or mechanical output.

7. The test apparatus of claim 1 further comprising a power source, wherein the power source comprises an internal battery and/or a power cord to connect to an external power source.

8. The test apparatus of claim 7, wherein the power source is operatively connected to a power flow indicator comprising a visual signal.

9. The test apparatus of claim 7, wherein the gear that is directly connected to the output shaft comprises a mechanical belt that transmits power to a second gear that is connected to a diametrically magnetized magnet.

10. The test apparatus of claim 1 further comprising an alignment arm for positioning a printed circuit board within the first printed circuit board connection port.

11. A method for testing a printed circuit board comprising:
inserting an electric component connector further comprising a first circuit board and second circuit board into a printed circuit board test apparatus;
programming a hard stop command to halt a hard-stop control;
communicating the hard stop command to the electric component connector;
causing a hard stop by activating a hard-stop control on the test apparatus in response to an electric signal from the electric component connector;
alerting a user via a viability signal a successful or failed attempt of stopping the hard-stop control.

12. The method of claim 11, wherein testing the printed circuit board further comprises pushing a push-button to activate a calibration test.

13. The method of claim 11, wherein testing the printed circuit board further comprises aligning the first printed circuit board on the a printed circuit board connection port with an alignment arm.

14. The method of claim 11, wherein testing the printed circuit board further comprises activating a motor with an electrical power supply.

15. The method of claim 11, wherein testing the printed circuit board further comprises rotating one or more gears within a gearbox.

16. The method of claim 15, wherein testing the printed circuit board further comprises turning an output shaft that is in direct contact with a gear in the gearbox.

17. The method of claim 16, wherein testing the printed circuit board further comprises transmitting power with a mechanical belt from the output shaft to a gear connected to a diametrically magnetized magnet.

18. The method of claim 17, wherein testing the printed circuit board further comprises producing a change in a magnetic field of the diametrically magnetized magnet.

19. The method of claim 18, wherein testing the printed circuit board further comprises detecting magnetic field changes with the second circuit board in a diametrically magnetized magnet.

20. The method of claim 11, wherein testing the printed circuit board further comprises pressing a plurality of release valves to release the printed circuit board from the test apparatus.

* * * * *